United States Patent [19]  
Sugimoto et al.

[11] 4,091,339  
[45] May 23, 1978

[54] OSCILLATOR

[75] Inventors: Takashi Sugimoto; Kazumasa Noyori, both of Yokohama, Japan

[73] Assignee: Tokyo Shibaura Electric Co., Ltd., Tokyo, Japan

[21] Appl. No.: 763,552

[22] Filed: Jan. 28, 1977

[30] Foreign Application Priority Data

Jan. 30, 1976 Japan ................... 51-9145

[51] Int. Cl.$^2$ ............................... H03B 5/12
[52] U.S. Cl. ................... 331/117 R; 361/131; 331/109
[58] Field of Search ............ 321/2, 18; 331/175, 331/176, 113 A, 109, 117 R, 183

[56] References Cited  
U.S. PATENT DOCUMENTS

| | | | |
|---|---|---|---|
| 3,222,618 | 12/1965 | Ressler | 331/175 |
| 3,377,567 | 4/1968 | Pontius | 331/176 |
| 3,387,228 | 6/1968 | Randall | 331/113 A |
| 3,388,344 | 6/1968 | West | 331/109 |
| 3,636,475 | 1/1972 | Steckler | 331/117 R |
| 3,851,276 | 11/1974 | Kaplan | 331/183 |

Primary Examiner—John Kominski  
Attorney, Agent, or Firm—Finnegan, Henderson, Farabow & Garrett

[57] ABSTRACT

An oscillator comprising an oscillation circuit including an oscillation transistor whose emitter is connected to the ground with respect to a D.C. signal; a detection circuit for detecting D.C. power source current supplied to said oscillation transistor; and a control circuit for controlling a D.C. bias voltage impressed on said oscillation transistor according to an output signal from the detection circuit, wherein the oscillation circuit, detection circuit and control circuit jointly constitute a negative feedback loop for sending direct current back to the source.

16 Claims, 6 Drawing Figures

4,091,339

OSCILLATOR

BACKGROUND OF THE INVENTION

This invention relates to an oscillator.

Hitherto, there has been widely accepted an oscillator comprising an oscillation active element, particularly an oscillation transistor.

With that type of oscillator in which the emitter of an oscillation transistor is connected to the ground with respect to a D.C. signal, for example, a Hartley type oscillator, it is necessary to fix oscillation current or emitter current so as to stabilize an oscillating condition, that is, an oscillation signal frequency and oscillation signal output, even where changes occur, for example, in ambient temperature or power source voltage.

FIG. 1 indicates the prior art Hartley type oscillator using an NPN transistor as an active oscillation element. The collector of an oscillation transistor $T_{r1}$ is connected to the ground through a capacitor $C_1$ with respect to an alternating current and also to the plus side of a D.C. source E. The emitter of said oscillation transistor $T_{r1}$ is connected to the junction of the inductive impedance elements $Z_1$, $Z_2$ of a tank circuit formed of said inductive impedance elements connected in parallel to a capacitive inductance element $Z_3$. The base of said oscillation transistor $T_{r1}$ is connected to the junction of the inductive impedance element $Z_1$ and capacitive impedance element $Z_3$ of the tank circuit through a capacitor $C_2$ for feeding back power source current and also to one end of an emitter current-controlling resistor $R_1$, the other end of which is connected to the junction of resistors $R_2$, $R_3$ constituting a potentiometer for dividing the voltage of the D.C. source E.

Where, with the above-mentioned arrangement, D.C. source current is supplied to the collector of the oscillation transistor $T_{r1}$, and the base of the oscillation transistor $T_{r1}$ is impressed with D.C. bias voltage represented by that portion of the voltage divided by the resistors $R_2$, $R_3$ which arises across both ends of the resistor $R_3$, then an oscillation signal is issued from the output terminal OUT of the oscillator.

Obviously in this case, it is preferred that the oscillation signal be stabilized in frequency and power, and that even where changes occur in ambient temperature or power source voltage, oscillation current, or the emitter current $I_{e1}$ of the oscillation transistor $T_{r1}$ be kept constant.

The customary practice to stabilize the emitter current $I_{e1}$ has been to provide a resistor on the collector or emitter side of the oscillation transistor $T_{r1}$ to fix D.C. bias voltage impressed on the base thereof.

Where, however, a resistor is used on the collector side of the oscillation transistor $T_{r1}$ a quantity of electricity charged in the tank circuit during one period of discharging of the capacitor $C_1$ is decreased in proportion to a time constant defined by a product arrived at by multiplying the resistance of the resistor and the capacitance of the capacitor $C_1$, undesirably resulting in a decline in an oscillation output. In contrast, where a resistor is provided on the emitter side of the oscillation transistor $T_{r1}$, the selectivity Q of the tank circuit falls, also leading to a decrease in an oscillation signal output.

SUMMARY OF THE INVENTION

It is accordingly an object of this invention to provide an oscillator capable of producing a stable oscillation signal without a drop in an oscillation signal output.

According to an aspect of the invention, there is provided an oscillator which comprises a D.C. source; an oscillation circuit including an active oscillation element; a detection circuit for detecting D.C. power source current supplied to the oscillation circuit; and a control circuit for controlling D.C. bias voltage impressed on the active oscillation element of the oscillation circuit, wherein the oscillation circuit, detection circuit and control circuit constitutes a negative feedback loop for sending back the D.C. source current.

DETAILED DESCRIPTION OF THE PREFERRED EMBODIMENTS

Figure 2:
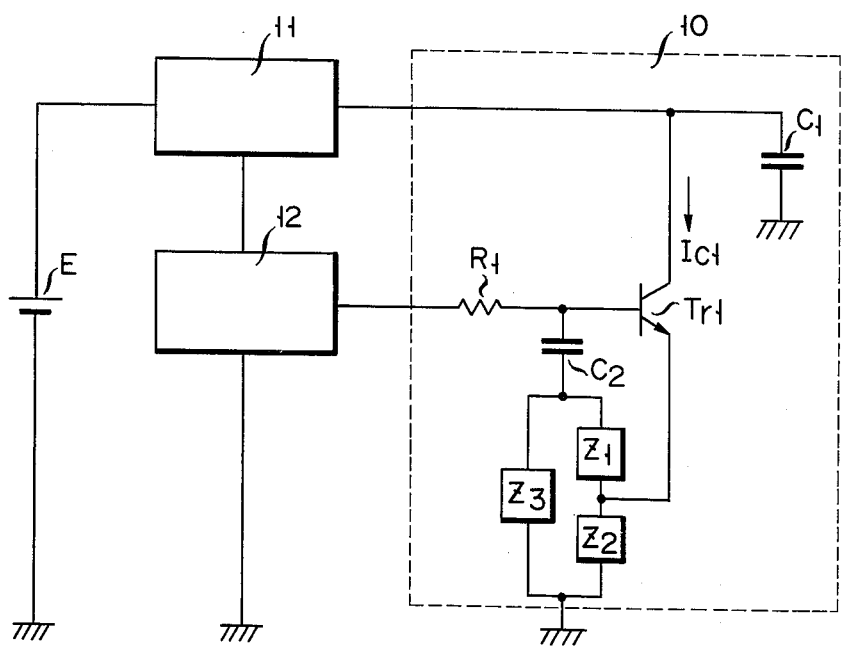
FIG. 2 is a fractional block circuit diagram of an oscillator according to one embodiment of this invention.

There will now be described an oscillator according to a first embodiment of this invention by reference to FIG. 2 showing a fractional block circuit diagram of said oscillator. The oscillation circuit 10 of the present oscillator has the same arrangement as the prior art oscillation circuit. However, the oscillator of this invention differs from that of the prior art in that a D.C. power source current-detecting circuit 11 for detecting current $I_{c1}$ flowing through the collector of an NPN type oscillation transistor $T_{r1}$ or source current and a control circuit 12 for controlling D.C. bias voltage impressed on the oscillation transistor $T_{r1}$ according to an output signal from said detection circuit 11 are provided between the oscillation circuit 10 and a D.C. source E.

With the oscillator of the above-mentioned arrangement, the collector of the oscillation transistor $T_{r1}$ of the oscillation circuit 10, D.C. power source current-detecting circuit 11, D.C. bias voltage-controlling circuit 12, resistor $R_1$ and the base of the oscillation transistor $T_{r1}$ jointly constitute a negative D.C. feedback loop with respect to D.C. source current running through the oscillation transistor $T_{r1}$. The oscillating condition of the present oscillator is stabilized by the negative feedback of D.C. source current.

Figure 3:
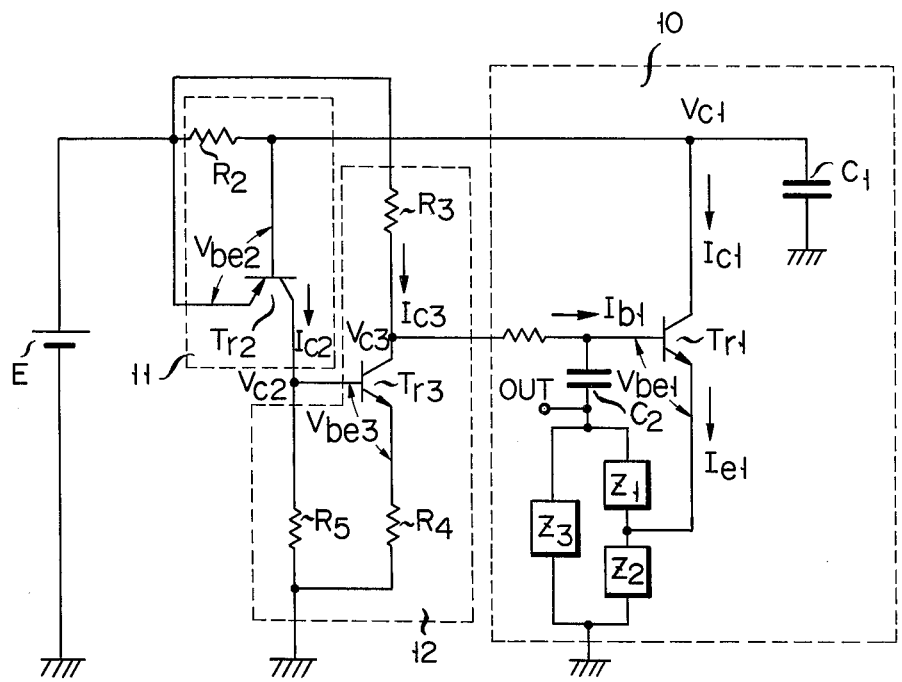
FIG. 3 is a concrete circuit diagram of the embodiment of FIG. 2.

Referring to FIG. 3 showing a concrete circuit diagram of an oscillator according to a first embodiment of this invention, the oscillation circuit 10 comprises an NPN oscillation transistor $T_{r1}$; a capacitor $C_1$ causing the collector of the oscillation transistor $T_{r1}$ to be grounded with respect to an A.C. signal; an emitter current-controlling resistor $R_1$ connected to the base of the oscillation transistor $T_{r1}$; a tank circuit formed of inductive impedance elements $Z_1$, $Z_2$, and capacitive impedance element $Z_3$ and connected between the base and emitter of the oscillation transistor $T_{r1}$ through an oscillation current feedback capacitor $C_2$. The power source current-detecting circuit 11 comprises a resistor $R_2$, one end of which is connected to the collector of the oscillation transistor $T_{r1}$ and the other end of which is connected to the positive side of the power source E and a source current-detecting transistor $T_{r2}$, whose emitter is connected to the power source side of the resistor $R_2$ and whose base is connected to that side of the resistor $R_2$ which faces the collector of the oscillation transistor $T_{r1}$. The D.C. bias voltage control circuit 12 comprises a D.C. voltage-controlling transistor $T_{r3}$ whose base is connected to the collector of the source current-detecting transistor $T_{r2}$, and whose collector is connected to the emitter current-controlling resistor $R_1$ of the oscillation circuit 10; a potentiometer resistor $R_3$, one end of which is connected to the collector of the D.C. voltage-controlling transistor $T_{r3}$, and the other end of which is connected to the positive side of the power source E and the emitter of the source current-detecting transistor $T_{r2}$; a potentiometer resistor $R_4$, one end of which is connected to the emitter of the D.C. voltage-controlling transistor $T_{r3}$ and the other end of which is connected to the ground; and a resistor $R_5$, one end of which is connected to the base of the D.C. voltage-controlling transistor $T_{r3}$, and the other end of which is connected to the ground.

There will now be described the principle by which an oscillator of the above-mentioned arrangement can effect stable oscillation. Now let it be assumed that while the subject oscillator is operated, an increase arises in the emitter current $I_{e1}$ of the oscillator transistor $T_{r1}$ due to, for example, changes in source voltage or ambient temperature. Generally, the emitter current $I_{e1}$ is expressed as a sum of the collector current $I_{c1}$ and the base current $I_{b1}$. Since, however, the base current $I_{b1}$ is negligibly small, the emitter current $I_{e1}$ is substantially equal to the collector current $I_{c1}$. Therefore, an increase in the emitter current $I_{e1}$ practically means a rise in the collector current $I_{c1}$. Further, as seen from the appended drawings, the collector current $I_{c1}$ is also source current. Where, therefore, the emitter current $I_{e1}$ of the oscillation transistor $T_{r1}$, namely, source current increases, then a more prominent drop appears in the voltage impressed across both ends of the resistor $R_2$, resulting in a larger potential difference $V_{be2}$ between the emitter and base of the source current-detecting transistor $T_{r2}$. Accordingly, the collector current $I_{c2}$ of the transistor $T_{r2}$ and in consequence the collector voltage $V_{c2}$ thereof rise. Where an increase arises in the collector voltage $V_{c2}$, namely, a potential difference $V_{be3}$ between the base and emitter of the D.C. voltage-controlling transistor $T_{r3}$, then the collector current $I_{c3}$ of the transistor $T_{r3}$ increases. Since, at this time, the collector voltage $V_{c3}$ of the transistor $T_{r3}$ drops, a potential difference $V_{be1}$ between the base and emitter of the oscillation transistor $T_{r1}$ is reduced, leading to a decrease in the collector current $I_{c1}$ of the oscillation transistor $T_{r1}$, namely, source current. A fall in the collector current $I_{c1}$, namely, source current means a decrease in the emitter current $I_{e1}$, thus enabling said emitter current $I_{e1}$ to be kept constant.

As apparent from the foregoing description, the collector current $I_{c1}$ or source current (substantially, emitter current $I_{e1}$) is kept constant by a D.C. negative feedback loop formed of the oscillation circuit 10, source current-detecting circuit 11 and D.C. bias voltage-controlling circuit 12, thereby stabilizing the oscillating condition of the oscillator, namely, the frequency and power of an osicllation signal.

There will now be described by reference to FIG. 4 an oscillator according to another embodiment of this invention. The embodiment is similar to the preceding embodiment shown in FIG. 3 except that the oscillation transistor $T_{r1}$ and the D.C. voltage-controlling transistor $T_{r3}$ are of a PNP type, a transistor $T_{r2}$ is of an NPN type, and the polarity of the D.C. source E is reversed from that of the embodiment of FIG. 3.

Figure 4:
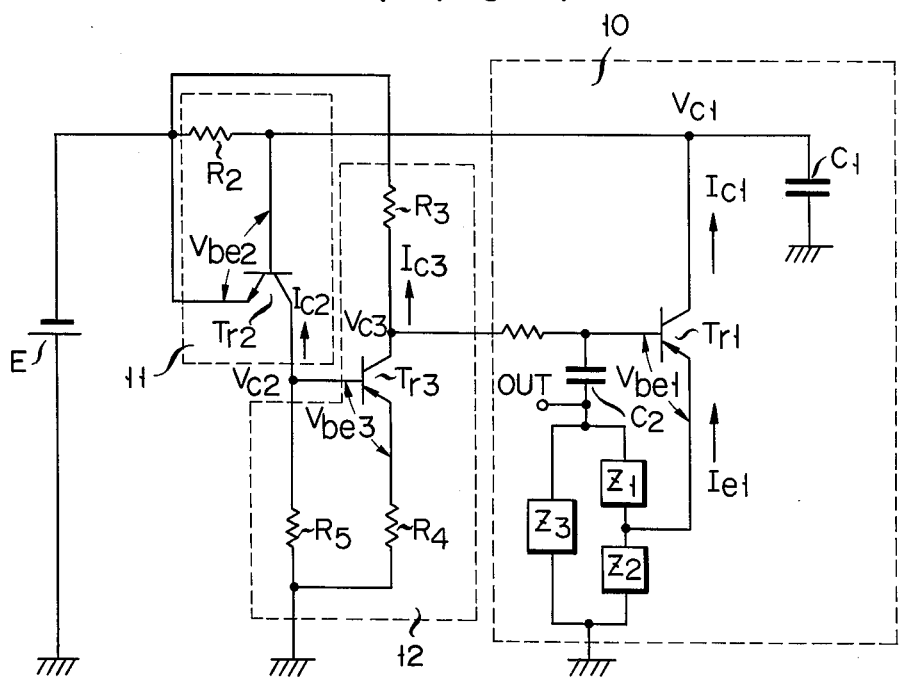
FIG. 4 is a concrete circuit diagram of an oscillator according to another embodiment of the invention.

The principle by which the oscillating condition of the embodiment of FIG. 4 is kept constant is substantially the same as in the embodiment of FIG. 3, description thereof being omitted.

Figure 1:
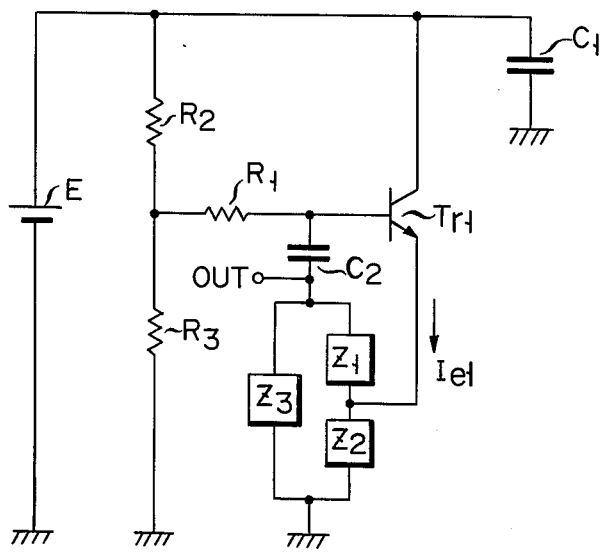
FIG. 1 is a circuit diagram of the prior art oscillator.
Figure 5:
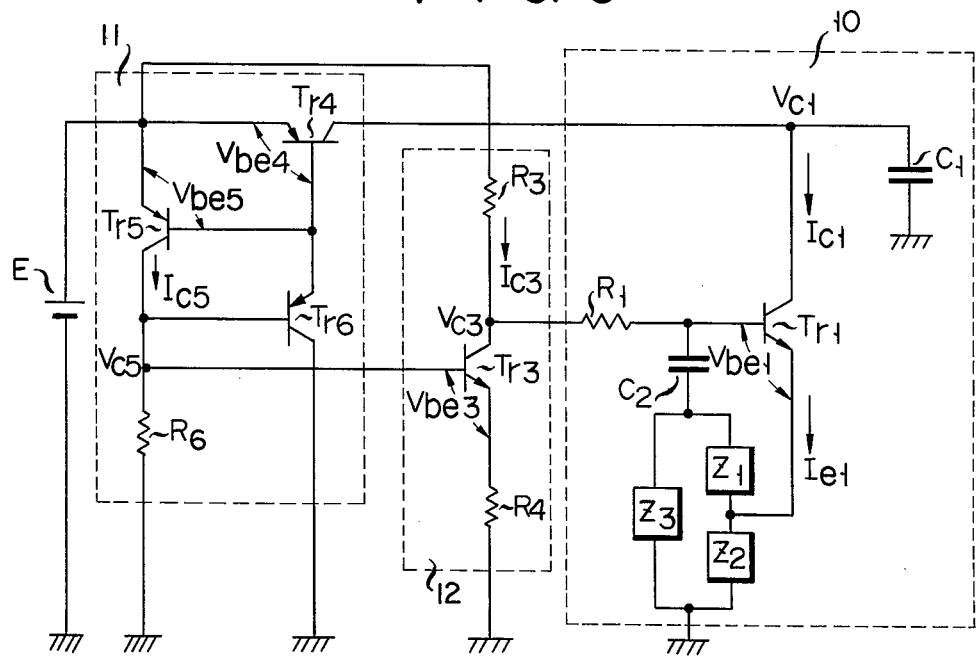
FIG. 5 is a concrete circuit diagram of an oscillator according to still another embodiment of the invention.

With still another embodiment shown in FIG. 5, the oscillation circuit 10 and D.C. bias voltage-controlling circuit 12 are respectively arranged in the same manner as in the embodiment of FIG. 3. Parts of FIG. 5 the same as those of FIG. 3 are denoted by the same numerals, description thereof being omitted. Reference is only made to the source current-detecting circuit 11. This source current-detecting circuit 11 comprises a transistor $T_{r4}$ corresponding to the resistor $R_2$ of FIG. 1, a transistor $T_{r5}$ corresponding to the transistor $T_{r2}$ of FIG. 1 and a transistor $T_{r6}$ for conducting current through the bases of the transistors $T_{r4}$, $T_{r5}$. The emitter of the transistor $T_{r4}$ is connected to the positive side of the D.C. source E, and the collector thereof is connected to the collector of the transistor $T_{r1}$. The emitter of the transistor $T_{r5}$ is connected to the positive side of the power source E and also to the resistor $R_3$ of the D.C. bias voltage-controlling circuit 12. The base of the transistor $T_{r5}$ is connected to the base of the transistor $T_{r4}$. The base of the transistor $T_{r6}$ is connected to the collector of the transistor $T_{r5}$ and further the ground through the resistor $R_6$. The emitter of the transistor $T_{r6}$ is connected to the bases of the transistors $T_{r4}$, $T_{r5}$, and the collector of the transistor $T_{r6}$ is connected to the ground.

There will now be described the principle by which the oscillating condition of the embodiment of FIG. 5 is stabilized. Now let it be assumed that an increase in, for example, ambient temperature or source voltage has resulted in a rise to the emitter current $I_{e1}$ of the oscillation transistor $T_{r1}$. Since this means an increase in the collector current $I_{c1}$, namely, source current, a larger potential difference $V_{be4}$ takes places between the base and emitter of the transistor $T_{r4}$ and similarly a larger potential difference $V_{be5}$ occurs between the base and emitter of the transistor $T_{r5}$. At this time, an increase in the collector current $I_{c5}$ of the transistor $T_{r5}$ leads to a rise in the collector voltage $V_{c5}$ thereof. A rise in the collector voltage $V_{c5}$ which means a larger potential difference $V_{be3}$ between the base and emitter of the D.C. voltage-controlling transistor $T_{r3}$ results in an increase in the collector current $I_{c3}$ thereof. The resultant drop in the collector voltage of the transistor $T_{r3}$ leads to a decrease in a potential difference $V_{be1}$ between the base and emitter of the oscillation transistor $T_{r1}$, with a decline in the collector current of the oscillation transistor $T_{r1}$, namely, in the source current and practically in the emitter current $I_{e1}$. The transistor $T_{r6}$ forms a base current path for the transistors $T_{r4}$ and $T_{r5}$.

As in the preceding embodiments of FIGS. 3 and 4, the embodiment of FIG. 5 enables the emitter curent $I_{e1}$ to be kept constant by the D.C. negative feedback loop formed of the oscillation circuit 10, source current-detecting circuit 11, and D.C. bias voltage-controlling circuit 12, thereby stabilizing the oscillating condition of the subject oscilator.

There will now be described by reference to FIG. 6 an oscillator according to a further embodiment of this invention.

This embodiment is similar to the preceding embodiment shown in FIG. 5 except that the oscillation transistor $T_{r1}$ and the D.C. voltage controlling transistor $T_{r3}$ are of a PNP type, the transistors $T_{r4}$, $T_{r5}$, $T_{r6}$ are of an NPN type, and the polarity of the source voltage is reversed from that of FIG. 5.

Figure 6:
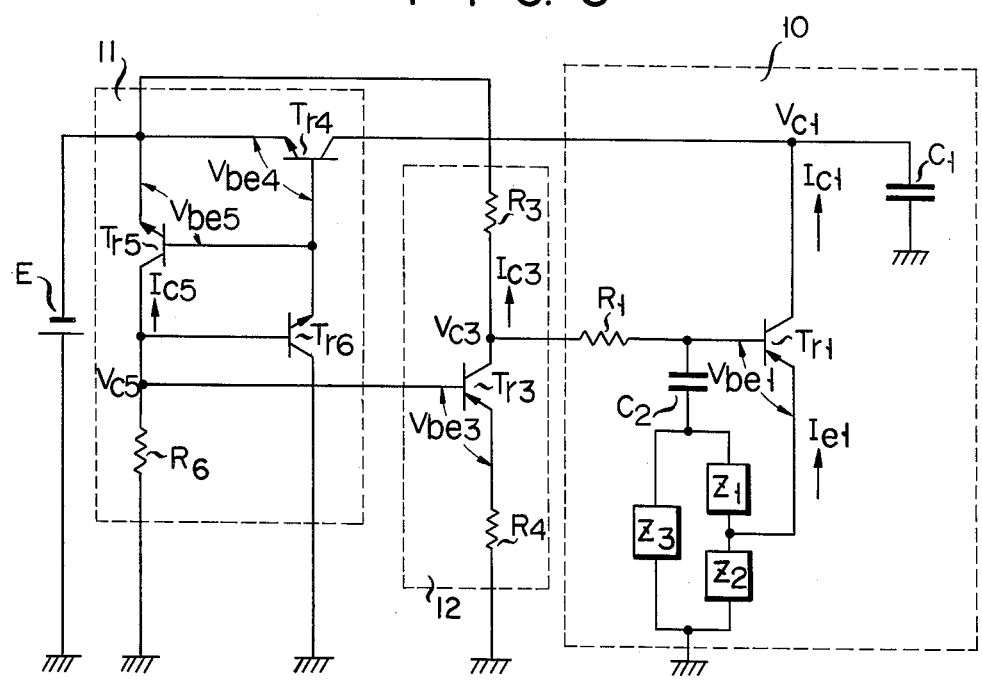
FIG. 6 is a concrete circuit diagram of an oscillator according to a further embodiment of the invention.

The principle by which the oscillating condition of the embodiment of FIG. 6 is stabilized is substantially the same as in the embodiment of FIG. 5, description thereof being omitted.

As seen from the description of the embodiments of FIGS. 3 to 6, the oscillator of this invention comprises an oscillation circuit 10; a D.C. power source current-detecting circuit 11 and D.C. bias voltage-controlling circuit 12 for controlling D.C. bias voltage impressed on the oscillation transistor $T_{r1}$ of the oscillation circuit 10, and is characterized in that the oscillation circuit 10, source current-detecting circuit 11 and D.C. bias voltage-controlling circuit 12 collectively constitute a D.C. negative feedback loop of source current, and the oscillating condition of the subject oscillator namely, the frequency and power of an output oscillation signal therefrom is stabilized by feeding back the source current through said negative feedback loop.

What we claim is:

1. An oscillator which comprises
   a D.C. power source having a first terminal connected to ground;
   an oscillation circuit including a first oscillation transistor used as an active oscillation element, a first capacitor for connecting the collector of the first transistor to ground with respect to an A.C. signal, a tank circuit having first and second inductive impedance elements and capacitive impedance element, the junction of the first and second inductive impedance elements being connected to the emitter of the first transistor, and the junction of the first inductive impedance element and capacitive impedance element being connected to ground, an oscillation current feedback capacitor connected between the junction of the second inductive impedance element with the capacitive impedance element and the base of the first transistor, and a first emitter current-controlling resistor, one end of which is connected to the base of the first transistor;
   a D.C. power source current-detecting circuit including a second resistor, one end of which is connected to a second terminal of power source and the other end of which is connected to the collector of the first transistor, and a second transistor whose emitter is connected to said one end of the second resistor and whose base is connected to said other end of the second resistor; and
   a D.C. bias voltage-controlling circuit including a third transistor whose collector is connected to the other end of the first resistor and whose base in connected to the collector of the second transistor, a first potentiometer resistor one end of which is connected to the collector of the third transistor, and the other end of which is connected to the second terminal of the power source; and
   wherein the oscillation circuit, D.C. power source current-detecting circuit and D.C. bias voltage-controlling circuit collectively constitute a negative feedback loop of the D.C. power source current.

2. The oscillator according to claim 1 wherein the D.C. bias voltage-controlling circuit further includes a second potentiometer resistor, one end of which is connected to ground and the other end of which is connected to the emitter of the third transistor.

3. The oscillator according to claim 1 wherein the D.C. bias voltage-controlling circuit further includes a third resistor one end of which is connected to ground and the other end of which is connected to the base of the third transistor.

4. The oscillator according to claim 1 wherein the D.C. bias voltage-controlling circuit further includes a second potentiometer resistor, one end of which is connected to ground and the other end of which is connected to the emitter of the third transistor and a third resistor, one end of which is connected to ground and the other end of which is connected to the base of the third transistor.

5. The oscillator according to claim 1, wherein the second terminal of the power source is positive with respect to ground; the first and third transistors are of an NPN type; and the second transistor is of a PNP type.

6. The oscillator according to claim 1, wherein the second terminal of the power source is negative with respect to ground; the first and third transistors are of a PNP type; and the second transistor is of an NPN type.

7. The oscillator according to claim 1, wherein the first and second inductive impedance elements are coils.

8. The oscillator according to claim 1, wherein the capacitive impedance element is a capacitor.

9. An oscillator which comprises
   a D.C. source having a first terminal connected to ground;
   an oscillation circuit including a first oscillation transistor used as an active oscillation element, a first capacitor for connecting the collector of the first transistor to ground with respect to an A.C. signal, a tank circuit formed of first and second inductive impedance elements and a capacitive impedance element, the junction of the first and second inductive impedance elements being connected to the emitter of the first transistor, and the junction of the first inductive impedance element and capacitive impedance element being connected to ground, an oscillation current feedback capacitor connected between the junction of the second inductive impedance element and capacitive impedance element and the base of the first transistor, and a first emitter current-controlling resistor, one end of which is connected to the base of the first transistor;
   a D.C. power source current-detecting circuit including a second transistor, whose collector is connected to the collector of the first transistor and whose emitter is connected to a second terminal of the power source, a third transistor whose emitter is connected to the second terminal of the source, and whose base is connected to the base of the second transistor, a fourth transistor whose emitter is connected to the base of the second and third transistors, whose base is connected to the collector of the third transistor and whose collector is connected to ground; and
   the D.C. bias voltage-controlling circuit including a fifth transistor whose collector is connected to the other end of the first resistor, and whose base is connected to the collector of the third transistor, a first potentiometer resistor, one end of which is connected to the collector of the fifth transistor and the other end of which is connected to the second terminal of the power source; and wherein the oscillation circuit, D.C. power source current-detecting circuit and D.C. bias voltage-controlling circuit collectively constitute a negative feedback loop of the D.C. power source current.

10. The oscillator according to claim 9 wherein the current-detecting circuit further includes a third resistor, one end of which is connected to the collector of the third transistor and the other end of which is connected to ground.

11. The oscillator according to claim 9 wherein the D.C. bias voltage-controlling circuit further includes a second potentiometer resistor, one end of which is connected to the emitter of the fifth transistor and the other end of which is connected to ground.

12. The oscillator according to claim 9 wherein the current-detecting circuit further includes a third resistor, one end of which is connected to the collector of the third transistor and the other end of which is connected to ground and the D.C. bias voltage-controlling circuit further includes a second potentiometer resistor, one end of which is connected to the emitter of the fifth transistor and the other end of which is connected to ground.

13. The oscillator according to claim 9, wherein the second terminal of the power source is positive with respect to ground; the first and fifth transistors are of an NPN type; and the second, third and fourth transistors are of a PNP type.

14. The oscillator according to claim 9, wherein the second terminal of the power source is negative with respect to ground; the first and fifth transistors are of a PNP type; and the second, third and fourth transistors are of an NPN type.

15. The oscillator according to claim 9, wherein the first and second inductive impedance elements are coils.

16. The oscillator according to claim 9, wherein the capacitive impedance element is a capacitor.

* * * * *